United States Patent [19]

Tisack

[11] Patent Number: 5,236,636
[45] Date of Patent: Aug. 17, 1993

[54] IN-MOLD PLASMA TREATMENT

[75] Inventor: Michael D. Tisack, Ann Arbor, Mich.

[73] Assignee: Ford Motor Company, Dearborn, Mich.

[21] Appl. No.: 772,187

[22] Filed: Oct. 7, 1991

[51] Int. Cl.⁵ .................. B29C 45/00; B29C 71/04
[52] U.S. Cl. ............................ 264/22; 264/81;
 264/83; 264/571; 264/102; 264/132; 264/328.1;
 264/DIG. 78; 425/546; 425/DIG. 60; 427/525;
 427/536; 427/569
[58] Field of Search ............... 264/22, 81, 83, 255,
 264/106, 107, 101, 571, 129, 132, 328.1, 102,
 DIG. 78; 204/157.63; 425/546, 543, 174, DIG.
 60; 427/525, 536, 569

[56] References Cited

U.S. PATENT DOCUMENTS

| | | |
|---|---|---|
| 3,068,510 | 12/1962 | Coleman ........................ 264/22 |
| 3,182,103 | 5/1965 | Blaylock, Jr. et al. ............ 264/22 |
| 3,196,485 | 7/1965 | Battenfield et al. . |
| 4,107,049 | 8/1978 | Sano et al. . |
| 4,134,942 | 1/1979 | Mirr ............................ 264/26 |
| 4,265,730 | 5/1981 | Hirose et al. . |
| 4,315,808 | 2/1982 | Imada et al. . |
| 4,317,788 | 3/1982 | Imada et al. . |
| 4,548,867 | 10/1985 | Ueno et al. . |
| 4,752,426 | 6/1988 | Cho . |
| 4,806,296 | 2/1989 | Brewster ....................... 264/83 |
| 4,830,810 | 5/1989 | Ufer et al. ..................... 264/83 |
| 4,839,207 | 6/1989 | Yoshitomi et al. . |
| 4,933,123 | 6/1990 | Yoshida et al. ................. 264/22 |
| 4,948,628 | 8/1990 | Montgomery et al. . |
| 5,030,399 | 7/1991 | Walles et al. .................. 264/83 |
| 5,074,770 | 12/1991 | Graefe ........................ 425/546 |

FOREIGN PATENT DOCUMENTS 233846 8/1987 European Pat. Off. .
416791 3/1991 European Pat. Off. .

OTHER PUBLICATIONS

Liebel et al, "Pretreatment of Plastics Surfaces in the Low Pressure Plasma", Kunststaffe German Plastics, 1987.
Takahashi et al, "Plasma Treatment for Painting of Polypropylene Bumper", SAE 850320.
Yasuda et al, "Effect of Electrodeless Glow Discharge on Polymers", Journal of Applied Polymer Science, vol. 17, pp. 137-152, 1973.

Primary Examiner—Jeffery Thurlow
Assistant Examiner—Mathieu Vargot
Attorney, Agent, or Firm—Damian Porcari; Roger L. May

[57] ABSTRACT

A method of producing a plasma treated article in a mold tool having electrically isolated mold dies including the steps of placing an article to be treated with a plasma between at least one of the dies and the article to be treated and applying an electric field between the dies to create a plasma in the space.

11 Claims, 2 Drawing Sheets

IN-MOLD PLASMA TREATMENT

BACKGROUND OF THE INVENTION

1. Cross-Reference to Related Application

Copending patent application, by the same applicant and assigned to the same assignee, discloses related subject matter, entitled "Apparatus for Applying an Electric Field", U.S. Ser. No. 07/722,180, filed Oct. 7, 1991.

2. Field of the Invention

The present invention relates to a method for generating a plasma in a mold tool. More specifically, the invention relates to a method of treating a polymeric molded article with the plasma to make it more receptive, to coatings or to apply a coating on the article, for example painting.

3. Description of Related Art

It is known to expose articles to a plasma to change the surface composition of the article. Such exposure is generally termed "plasma treatment". Low pressure plasma treatment is useful for stabilizing a molded article containing a plasticizer and for making the article more receptive to coatings such as paints, lacquers, adhesives, films, etc. It is also useful to plasma-treat an article for antistatic purposes. Generally, low pressure plasma treatment involves placing the article to be treated in a chamber and reducing the chamber pressure to between 1-0.01 Torr. An ionizable gas is introduced into the chamber and the gas is transformed into a plasma. One method of creating the plasma is by passing the gas through an electric field created between two electrodes. The electric field excites the gas and ionizes the individual molecules of the gas to form a plasma. The plasma treats all exposed surfaces of the articles within the chamber. This method of treating one or more articles in a chamber is known as batch processing. The chamber must be stocked with articles for plasma treatment, and then the entire chamber evacuated to a relatively low pressure. The larger the chamber, the longer the evacuation time and more expensive and complex are the individual components necessary to draw vacuum and create a plasma. One such example of a batch processing plasma treatment is taught and described in U.S. Pat. No. 4,107,049 (Sano et al).

Surface modification, specifically for polymeric substrates, is useful for enhancing the adhesion properties of the substrate. Polymeric material such as polypropylene and polyethylene contain fully hydrogenated surfaces which are not polar and therefore not receptive to coatings. By exposing this surface to a plasma, various constituent molecules having more polar species can be grafted onto the polymer. These polar species enhance the adhesion of the surface to various coatings. Various surface modifications are described in Liebel and Bischoff, "Pretreatment of Plastics Surfaces in the Low-Pressure Plasma", Kunststaffe German Plastics, 1987; and in Takahashi, Fukuta, and Kaneko, "Plasma Treatment for Painting of Polypropylene Bumper", SAE 850320, both incorporated herein by reference.

Previous attempts to graft adhesion-promoting molecules onto a substrate required batch or semi-batch processing. Batch processing has previously been described as taught in Sano et al. Semi-batch processing consists of a series of chambers, each containing articles to be treated. The chambers are evacuated in series. The plasma is produced by a plasma generating means outside of the chambers. Once an individual chamber has been evacuated to the proper pressure, the plasma is introduced to treat the articles therein. Semi-batch processing permits the plasma to be created in one location while the chamber containing the article to be treated is evacuated. Semi-batch processing permits a slight increase in speed over batch processing. Because both batch and semi-batch processes use chambers having a volume far in excess of that required to create a plasma, these processes are still relatively inefficient.

It is an object of the present invention to provide a method for manufacturing a plasma treated article without using a large volume vacuum chamber.

It is a further object of the present invention to provide an efficient, low-cost method of plasma treating a molded article using the molding tools.

It is another object of the present invention to provide a method of injection molding and plasma treating a molded article using a single mold tool.

It is still another object of the present invention to provide a low-cost method for manufacturing an article receptive to a coating.

SUMMARY OF THE PREFERRED EMBODIMENTS

The present invention teaches a method of producing a plasma treated article in a mold tool having electrically isolated mold dies, comprising the steps of: placing an article to be treated with a plasma between the dies; introducing an ionizable gas into a space between at least one of the dies and the article to be treated; and applying an electric field between the dies to create a plasma in the space.

The space may be created either through shrinkage of the molded article or, more preferably, by moving the dies apart relative to one another. The volume of the space needed to create a plasma is relatively small in comparison to the volume of the part. Because of the small volume of the space, low-cost pumps and valves may be used to quickly evacuate the space to a relatively low pressure.

The dies are electrically isolated from one another. They may be electrically conductive and be spaced apart by an insulator. In the alternative, the dies themselves may be made from a dielectric material having a low dielectric loss factor such as ceramic. If an insulator is not used, only one die need be electrically nonconductive. The other die may be electrically conductive or electrically nonconductive. When using either one or more electrically nonconductive dies, separate electrodes are placed within or adjacent the dies to couple the electric field. Conductive dies do not require a separate electrode and act themselves as an electrode.

An ionizable gas is introduced into the space adjacent the molded article. Various ionizable gases are suitable for plasma treatment. Selecting the appropriate ionizable gas is dependent upon the type of molecule to be substituted and the surface of the article to be treated. In the case of adhesion promotion, molecules such as $O_2$, $CO_2$, $CO$, $NO_2$, $SO_2$, $NH_3$, $SF_6$, $N_2$, and many others, either separately or in combination, form a plasma which bonds well to Polymeric materials. The most common and least expensive gas useful for plasma treatment for adhesion promotion is air.

Plasma polymerizable coatings are also useful for treating articles. Techniques for forming polymerizable coatings is taught in Yasuda, Lamaze, and Sakaoku, "Effect of Electrodeless Glow Discharge on Polymers", *Journal of Applied Polymer Science*, Vol. 17, pp. 137-152 (1973), incorporated herein by reference. To form a plasma polymerized coating on an article, a polymerizable monomer such as hexamethyldisiloxane, ethylene, methymethacrylate, as well as many others, is introduced into the chamber. An electric field is applied to the gas and a plasma created. The plasma polymerizes onto the surface of the article. Polymerizable coatings are useful for a variety of functions, including Permeation resistance, durability, and abrasion resistance.

A plasma is created when a high frequency electric field is applied to an ionizable gas under low pressure. This electric field is preferably applied by connecting one terminal of a radio frequency (RF) generator through an impedance matching network to the molding equipment. Both dies are electrically conductive, but one die is electrically isolated from the molding equipment. This die is connected to one terminal of the RF generator. The other die is conductive with the molding equipment and is connected to the ground terminal of the RF generator. The dies themselves act as electrodes for the RF generator. The RF generator applies an electric field between the dies. The electric field creates a plasma from the gas within the space. A molded article between the dies is exposed to the plasma and free radicals formed by the electric field are substituted on the surface of the article. To avoid a buildup of ions or electrons adjacent the electrodes, an alternating electric field is used.

When the electric field is withdrawn, the plasma returns to a gaseous state and the article is removed from the mold. The surface of the molded article has been altered by substituting free radicals from the plasma onto the article surface. When the article is made from a polymeric material, this surface treatment raises the Gibbs free energy of the surface. To lower this Gibbs free energy, the substrate often rotates the surface polymeric chains to encase the substituted molecules within the substrate. The substrate surface attempts to return to irs hydrogenated, low polar character and reduces the adhesion properties of the substrate. To avoid this rotation, it is preferable to coat the plasma treated article before it has lowered its Gibbs free energy through internalization of the substituted radicals.

The present invention provides an efficient, low-cost method of manufacturing a plasma treated article by creating a plasma in a small volume space. By using electrically isolated mold dies as the electrodes, separate vacuum chambers and plasma-generating vessels are eliminated. Creating a plasma after an article has been freshly molded reduces the cycle time for plasma treatment and permits the plasma treatment of an article while still in a semi-molded and heated state. Separate reheating of the article to promote susceptibility to plasma treatment is unnecessary.

Another feature of the present invention is using plasma treatment during the cool-down phase of a molding cycle.

These and other objects, features, and advantages of the present invention will be more fully described with reference to the following detailed description and drawings.

DETAILED DESCRIPTION OF THE INVENTION

In a preferred embodiment of this invention, an injection molding apparatus is provided. Other molding apparatuses, including compression molding, low pressure compression molding, stamping, and blow molding are also possible using the methods taught herein.

The preferred embodiments include the plasma treatment of a polymeric substrate. The invention relates to the plasma treatment of any surface and is independent of the substrate or plasma used. Electrically conductive substrates may be plasma treated so long as they are electrically isolated from at least one mold die which is acting as an electrode so that a potential may be created in the space above the substrate.

Figure 1:
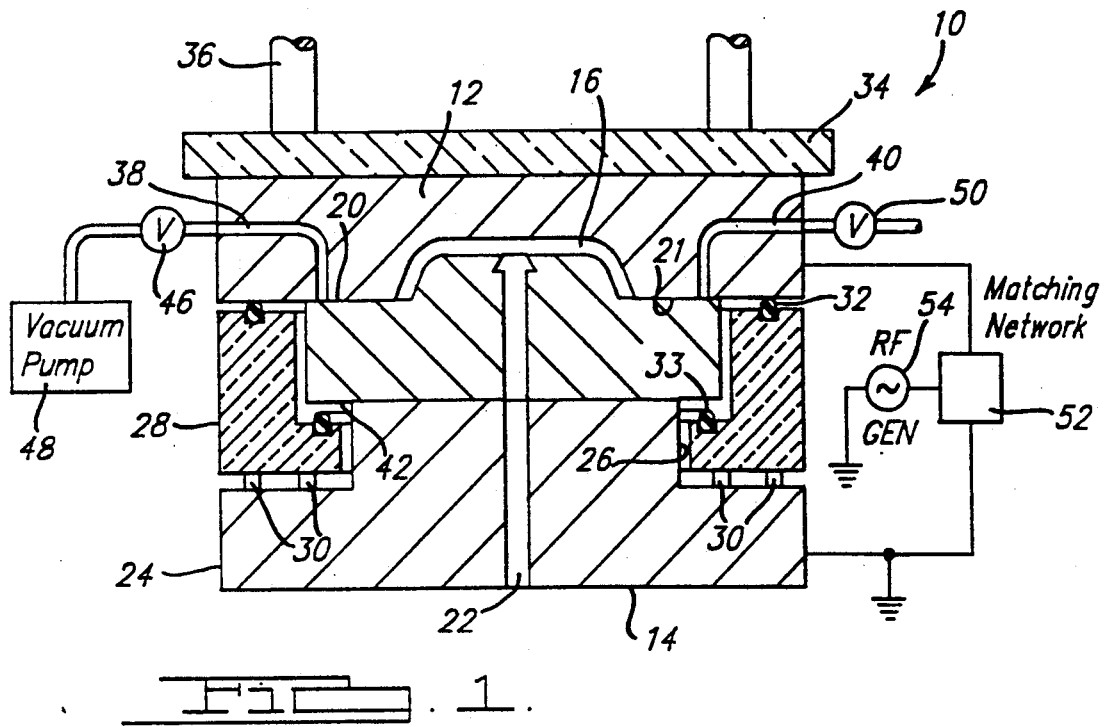
FIG. 1 is a sectional view of a mold tool having electrically isolated dies.

The invention will be described as a plasma treatment of an injection molded article as shown in FIGS. 1-4. FIG. 1 shows mold 10 having movable dies 12, 14. Dies 12, 14 ha e matched surfaces forming cavity 16 when closed. Cavity 16 provides the shape for molded article 18 shown in FIGS. 2-4. Dies 12, 14 are shown in the closed position in FIG. 1. Shoulder 20 of die 12 rests against shoulder 21 of die 14 when the mold is in the closed position. Sprue 22 communicates with cavity 16 and supplies a thermoformable polymeric material for molding article 18. A gate may be added to the end of sprue 22 to further direct the flow of material into cavity 16.

Die 14 is secured to base 24. Base 24 and die 14 remain stationary during the molding operation. Base 24 contains a raised portion 26 having a smaller diameter than die 14. Located intermediate base 24 and die 12 is sleeve 28. Sleeve 28 appears L-shaped when viewed in cross-section. Sleeve 28 acts as an electrically nonconductive isolator spacing dies 12, 14 apart. Sleeve 28 is attached to pistons 30 and is operable to raise die 12 from die 14. Sleeve 28 contains seals 32, 33. Die 12 is secured to dielectric isolator platen 34 through the use of nonconductive connectors (not shown). Platen 34 and sleeve 28 are preferably made from an electrically nonconductive material having a very low dielectric loss factor at radio frequencies. Particularly preferred as materials for the isolator platen are ceramics such as T-T zirconia because of its high compressive strength and fracture toughness. The sleeve can be formed from a ceramic material or from a polymeric material such as ultra-high molecular weight polyethylene.

Mold 10 is attached within hydraulic press 36. Hydraulic press 36 is of the type generally used for injection molding operations and may apply a force up to approximately 4000 tons. Hydraulic pressure from press 36 may also be diverted to pistons 30 to assist in raising and lowering sleeve 28. Pistons 30 may be alternatively operated by auxiliary hydraulic, pneumatic, or mechanical means.

Die 12 contains vacuum channel 38 and gas channel 40. Channels 38, 40 communicate with shoulder 20 and are normally sealed by shoulder 21 when the dies are in the closed position. Alternatively, channels 38, 40 may be placed within stationary die 14 to avoid using flexible connectors for gas and vacuum lines and injector feeds.

Figure 2:
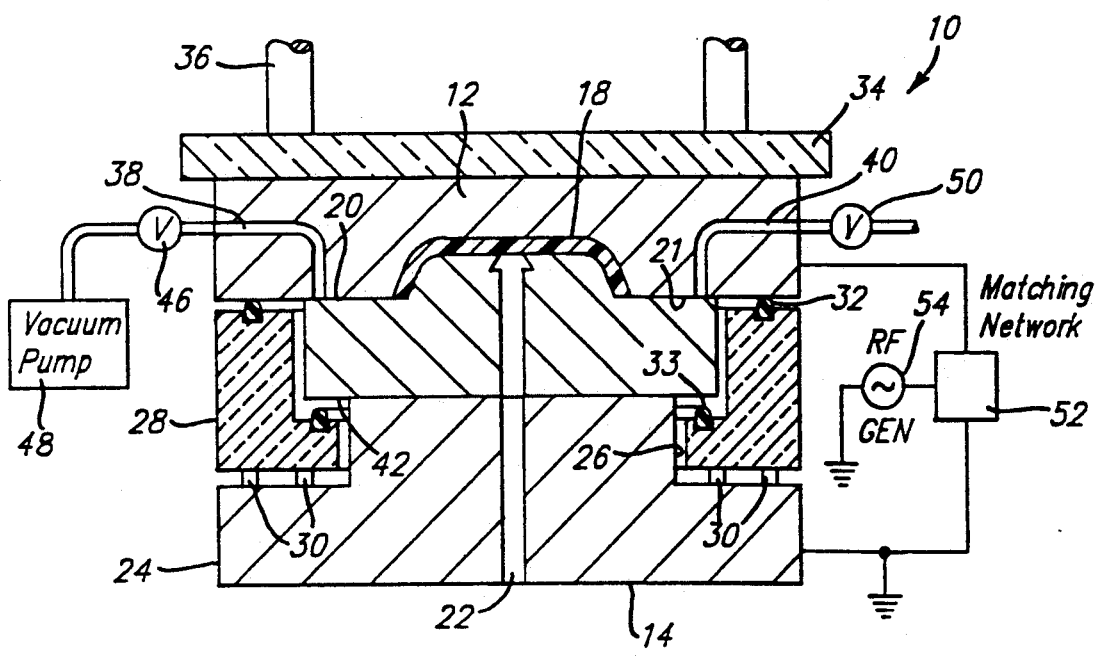
FIG. 2 is a sectional view of the mold illustrated in FIG. 1 showing the injection molding of an article.

Pistons 30 are retracted, lowering sleeve 28 as shown in FIGS. 1 and 2. Dies 12, 14 are closed and a pressure of approximately 4000 tons is applied to the dies by press 36. The amount of pressure applied by press 36 is dependent on molding temperature, material, mold shape, and article thickness.

Article 18 is molded within mold 10 by injecting a thermoformable material through sprue 22 into cavity 16. The thermoformable material flows throughout cavity 16 and takes the shape of molded article 18. The thermoformable material does not pass between shoulders 20, 21. After molded article 18 has cooled for a sufficient period of time that exterior pressure on the article from dies 12, 14 is no longer necessary, the clamping tonnage applied by press 36 is reduced.

Figure 3:
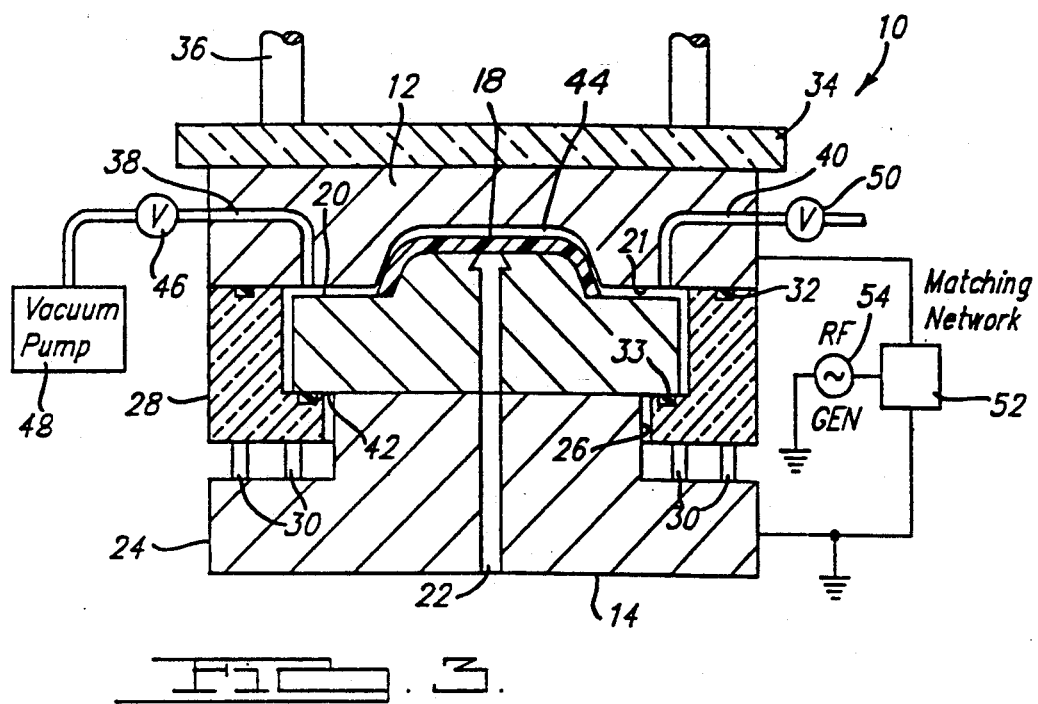
FIG. 3 is a sectional view of the mold illustrated in FIG. 1 showing the plasma treatment of the freshly molded article.
Figure 4:
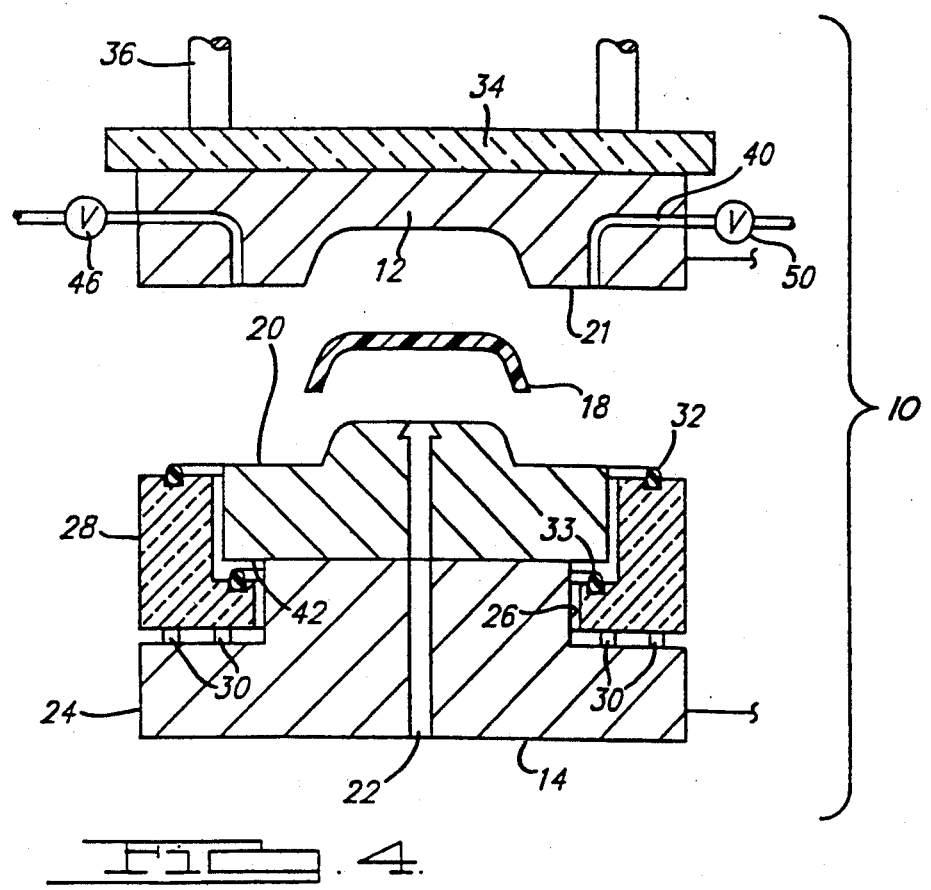
FIG. 4 is a sectional view of the mold illustrated in FIG. 1 in the open position showing the plasma treated article being removed.

Pistons 30 are moved to their extended position and raise sleeve 28, as shown in FIG. 3. Seal 32 contacts die 12 and forms an air-tight seal between sleeve 28 and die 12. Pistons 30 apply a greater force on die 12 than the opposing force applied by press 36. This differential assures that seal 32 seals against die 12 during the die separation process. Continued force from pistons 30 raises die 12 from die 14. Seal 33 engages the lower portion of die 14 and forms an air-tight seal between die 14 and sleeve 28. Pistons 30 need only apply a slightly greater pressure than press 36 to raise die 12 from die 14 and continually maintain a seal. Sleeve 28 is constrained from additional upward movement by the lower face 42 of die 14.

The displacement of die 12 forms a space 44. Space 44 is bounded on its upper surface by die 12 and on its lower surface by article 18 and die 14. Sleeve 24 seals the periphery of space 44. Shoulder 20 no longer engages shoulder 21, permitting channels 38, 40 to communicate with space 44. Valve 46 connects vacuum pump 48 with vacuum channel 38. Vacuum pump 48 evacuates space 44 to a pressure of between 0.1–1 Torr. Flow control valve 50 permits the introduction of an ionizable gas into space 44 at a Predetermined rate. The ionizable gas is drawn into space 44 by the vacuum created by pump 48. It is desirable to continue bleeding a quantity of ionizable gas into space 44 throughout the plasma treatment operation. The plasma treatment depletes the ionizable gas. Additional gas is introduced to maintain the plasma.

Selecting the appropriate ionizable gas is dependent upon the type of chemical functionality to be substituted on the surface of molded article 18. In the case of a polymeric article, gases such as $O_2$, $CO_2$, $NO_2$, air, and others, separately or in combination, are useful for promoting adhesion of coatings by the incorporation of polar functional groups. It has been found that these low-cost gases, or even air, can create a suitable plasma for plasma treatment of polymeric materials for adhesion enhancement. These ionizable gases are supplied to flow control valve 50 and introduced at a rate of approximately between 20–60 SCFM. A low pressure at approximately 0.1–1 Torr is maintained throughout the plasma treatment by vacuum pump 48.

Die 12 is connected to one terminal of impedance matching network 52. Base 24 is connected to the ground terminal. Network 52 is attached to RF generator 54. Generator 54 and network 52 are generally commercially available systems typified by model RFX-600 Generator and ATX-600 Tuner (matching network), manufactured by Advanced Energy Industries, Inc., Fort Collins, Colo. Generator 54 produces an electric field at a frequency of 13.56 MHz and at a variable power level from 0–600 watts. Network 52 matches the impedance of mold 10 in the extended sleeve position to permit complete coupling of the electric field density between dies 12 and 14.

Base 24 and die 14 are electrically conductive and may be made from tool steel. Die 12 is also electrically conductive and may be made from tool steel, but is electrically isolated from die 14 and base 24 via isolator platen 34 and sleeve 28. Dies 12, 14 act as electrodes for coupling the electric field in space 44. An electric field of 13.56 MHz (or multiples thereof) is applied to space 44. The Boltzmann distribution function predicts that a certain number of molecules or atoms of gas will exist as ions. These ions are excited by the electric field to increase the energy of the gas. The elevated energy of the gas produces a dielectric breakdown of the gas until a plasma is created in space 44. The plasma treats all exposed surfaces of article 18. Article 18 may be lifted from die 14 to expose additional surfaces to plasma treatment if desired (not shown).

The plasma treatment may comprise a surface substitution of atoms of molecules of the ionizable gas or a plasma polymerization of monomers onto the surface of article 18. In some instances, the elevated temperature of recently molded article 18 assists in the plasma treatment. Additional heating or cooling elements within dies 12, 14 may be used to tailor the plasma treatment to the particular substrate and plasma gases.

In the preferred embodiments of the invention, an article manufactured from rubber-modified polypropylene (TPO) is exposed to a plasma formed from air. After an exposure of approximately 10–30 seconds, the electric field is withdrawn. While not wishing to be bound by the following theory, it is believed that a majority of the ion substitution or plasma polymerization occurs after the withdrawal of the electric field. This is believed due to free radicals in the plasma combining with active sites on the surface of the article. To promote this effect and also reduce the overall time required for the plasma treatment, the electric field may be pulsed using the pulsing circuit taught and described in U.S. application Ser. No. 07/633,742, filed Dec. 24, 1990, entitled "Dielectric Curing of Adhesives", incorporated herein by reference. Pulsing is defined as rapidly applying and withdrawing the electric field. Pulsing has the effect of rapidly creating and withdrawing a plasma in space 44. It is belived that rapidly creating and withdrawing the plasma will promote plasma treatment for a defined period of time.

After sufficient plasma treatment of the molded article, sleeve 28 is retracted and mold 10 opened. Article 18 is removed f&om mold 10. Plasma treatment of polymeric material such as TPO for use as adhesion promotion does not remain effective indefinitely. Functional groups substituted onto the surface of the polymeric chains of the TPO tend to internalize via rotation to reduce the Gibbs free energy of the surface. The polar species grafted onto the polymer to promote adhesion are no longer exposed on the surface. When an article is exposed to plasma treatment for adhesion enhancement, it is preferable that the article be painted or bonded within 20–30 days after the plasma treatment. This length of time may vary depending upon the substrate material, type of plasma treatment, amount of surface substitution, and type of coating.

While the invention has been described in its preferred embodiments as a method of plasma treating an injection molded article, modifications and changes may be made without departing from the spirit and scope of the invention. The methods taught herein may be used with compression molding, stamping, or blow molding devices. In each of these alternative methods, electrically isolated dies are used to create a plasma in a space adjacent an article.

The invention has also been illustrated using the movement of one die relative to another to create a space adjacent the article. However, various articles may be manufactured which shrink upon cooling. BY electrically isolating the dies, the space created by the article shrinkage may be sufficient to create a plasma for treating the article. This would alleviate the need for moving the dies apart to create the space or providing a sleeve to seal between the dies. The dies would be electrically isolated when closed and maintain a seal for drawing a vacuum within the space. The vacuum and gas channels would communicate with the space created by the article shrinkage. The remainder of the process, including forming a plasma, would be the same as that described in the method of the preferred embodiments. Additionally, an article may be molded separately and then placed in a tool for subsequent plasma treatment.

The invention has been described by using electrically conductive dies separated by an electric isolator. Alternatively, the dies may be made from electrically nonconductive material and an electrode placed adjacent the die to create an electric field in the space adjacent the article. These as well as other changes and modifications to the preferred embodiments are intended to be included within the scope of the attached claims.

I claim:

1. A method of producing a plasma treated article in a mold tool having electrically isolated mold dies, comprising the steps of:
    injection molding an article between said dies;
    moving said dies apart relative to one another after said injection molding to create a space between at least one of said dies and said article;
    drawing a vacuum in said space;
    introducing an ionizable gas into said space; and
    applying an electric field between said dies to create a plasma in said space, said plasma reacting with the surface of said article to render the surface more receptive to a coating.

2. The method of claim 1, wherein said electric field is an alternating electric field at multiples of 13.56 MHz.

3. The method of claim 1, wherein said vacuum is between 1 Torr and 0.01 Torr.

4. The method of claim 1, wherein said ionizable gas is air.

5. The method of claim 1, wherein said ionizable gas is polymerizable.

6. The method of claim 1, further comprising the step of sealing between said dies before the step of drawing said vacuum.

7. The method of claim 1, further comprising the step of coating said molded article with a coating.

8. The method of claim 1, wherein said molded article is a polymer.

9. The method of claim 1, further comprising the step of pulsing said electric field.

10. The method of producing a painted article, comprising the steps of:
    injection molding an article between two dies at an elevated temperature;
    moving said dies apart relative to one another after said injection molding thereby creating a space between one of said dies and said molded article;
    drawing a vacuum in said space;
    introducing an ionizable gas into said space;
    electrically isolating said dies;
    applying an electric field between said dies to create a plasma in said space while said molded article is at an elevated temperature, said plasma reacting with the surface of said molded article whereby said molded article is more receptive to painting; and
    painting said plasma treated article.

11. A method of producing a plasma treated article in a tool having electrically isolated conductive dies, comprising the steps of:
    injection molding an article between two dies at an elevated temperature;
    moving said dies apart relative to one another after said injection molding thereby creating a space between one of said dies and said molded article;
    drawing a vacuum in said space;
    introducing an ionizable gas into said space;
    applying an electric field between said dies to create a plasma in said space while said molded article is at an elevated temperature, said plasma reacting with the surface of said molded article whereby said molded article is more receptive to painting; and
    painting said plasma treated article.

* * * * *